(12) United States Patent
Mimura et al.

(10) Patent No.: US 12,745,540 B2
(45) Date of Patent: Sep. 22, 2026

(54) DISPLAY DEVICE HAVING OVERHANG STRUCTURE AND SEALING LAYER

(71) Applicant: Magnolia White Corporation, Tokyo (JP)

(72) Inventors: Toshifumi Mimura, Tokyo (JP); Hiraaki Kokame, Tokyo (JP); Kaichi Fukuda, Tokyo (JP); Atsushi Takeda, Tokyo (JP); Noriyuki Hirata, Tokyo (JP)

(73) Assignee: MAGNOLIA WHITE CORPORATION, Tokyo (JP)

(*) Notice: Subject to any disclaimer, the term of this patent is extended or adjusted under 35 U.S.C. 154(b) by 686 days.

(21) Appl. No.: 18/171,762

(22) Filed: Feb. 21, 2023

(65) Prior Publication Data

US 2023/0269991 A1 Aug. 24, 2023

(30) Foreign Application Priority Data

Feb. 22, 2022 (JP) ................................ 2022-025972

(51) Int. Cl.
*H10K 59/80* (2023.01)

(52) U.S. Cl.
CPC .................................. *H10K 59/871* (2023.02)

(58) Field of Classification Search
CPC .................................................... H10K 59/871
See application file for complete search history.

(56) References Cited

U.S. PATENT DOCUMENTS

| | | | |
|---|---|---|---|
| 5,952,037 | A | 9/1999 | Nagayama et al. |
| 7,977,873 | B2 | 7/2011 | Asano |
| 2002/0140041 | A1 | 10/2002 | Endoh |
| 2003/0054630 | A1 | 3/2003 | Kirchhoff |
| 2003/0164674 | A1 | 9/2003 | Imamura |
| 2004/0160170 | A1 | 8/2004 | Sato et al. |
| 2007/0188093 | A1 | 8/2007 | Nagara et al. |

(Continued)

FOREIGN PATENT DOCUMENTS

| | | | |
|---|---|---|---|
| CN | 106057804 | A | 10/2016 |
| CN | 106876605 | A | 6/2017 |

(Continued)

OTHER PUBLICATIONS

Japanese Office Action issued Nov. 18, 2025, in correponding JP Application No. 2022-025972, 10pp.

(Continued)

*Primary Examiner* — Suberr L Chi
(74) *Attorney, Agent, or Firm* — XSENSUS LLP

(57) ABSTRACT

According to one embodiment, a display device includes first and second lower electrodes, a rib, a partition including a lower portion and an upper portion, a first organic layer disposed on the first lower electrode, a second organic layer disposed on the second lower electrode, a first upper electrode disposed on the first organic layer, a second upper electrode disposed on the second organic layer, a first sealing layer disposed above the first upper electrode, in contact with the lower portion and extending to above the upper portion and a second sealing layer disposed above the second upper electrode, in contact with the lower portion, extending to above the upper portion, and spaced apart from the first sealing layer.

20 Claims, 12 Drawing Sheets

(56) References Cited

U.S. PATENT DOCUMENTS

| | | | | |
|---|---|---|---|---|
| 2009/0009069 | A1 | 1/2009 | Takata | |
| 2012/0217516 | A1 | 8/2012 | Hatano et al. | |
| 2016/0043161 | A1* | 2/2016 | Miyazawa | H10K 59/122 257/40 |
| 2019/0363275 | A1 | 11/2019 | Ochi et al. | |
| 2022/0029130 | A1 | 1/2022 | Seo et al. | |

FOREIGN PATENT DOCUMENTS

| | | | |
|---|---|---|---|
| CN | 107799663 | A | 3/2018 |
| CN | 108232036 | A | 6/2018 |
| CN | 109216406 | A | 1/2019 |
| CN | 109994642 | A | 7/2019 |
| CN | 113707827 | A | 11/2021 |
| CN | 113991039 | A | 1/2022 |
| CN | 116058108 | A | 5/2023 |
| CN | 116261925 | A | 6/2023 |
| JP | 2000-195677 | A | 7/2000 |
| JP | 2002-299604 | A | 10/2002 |
| JP | 2004-207217 | A | 7/2004 |
| JP | 2006196429 | A | 7/2006 |
| JP | 2008-135325 | A | 6/2008 |
| JP | 2008-165251 | A | 7/2008 |
| JP | 2009-32673 | A | 2/2009 |
| JP | 2009146734 | A | 7/2009 |
| JP | 2010-118191 | A | 5/2010 |
| JP | 2010198926 | A | 9/2010 |
| JP | 7727738 | B2 | 8/2025 |
| WO | 2018/179308 | A1 | 10/2018 |
| WO | 2022050984 | A1 | 3/2022 |

OTHER PUBLICATIONS

Office Action issued May 18, 2026 in corresponding Chinese patent application No. 202310152982.5 (37 pages; with English machine translation).

* cited by examiner

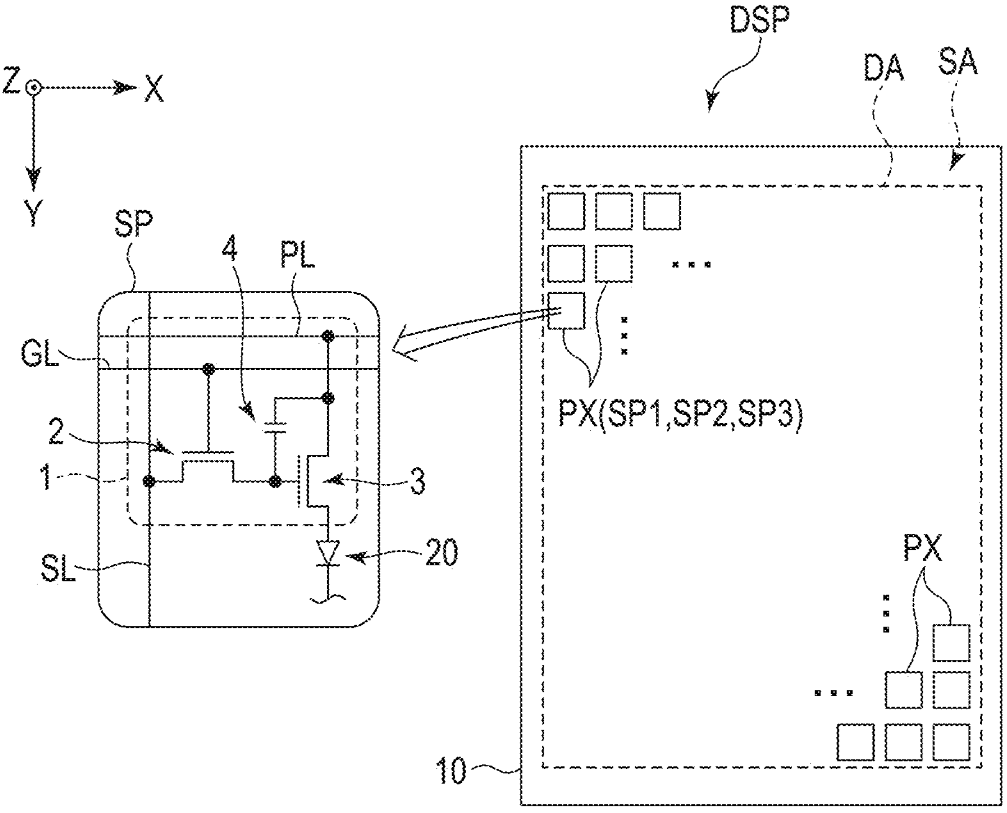
F I G. 1

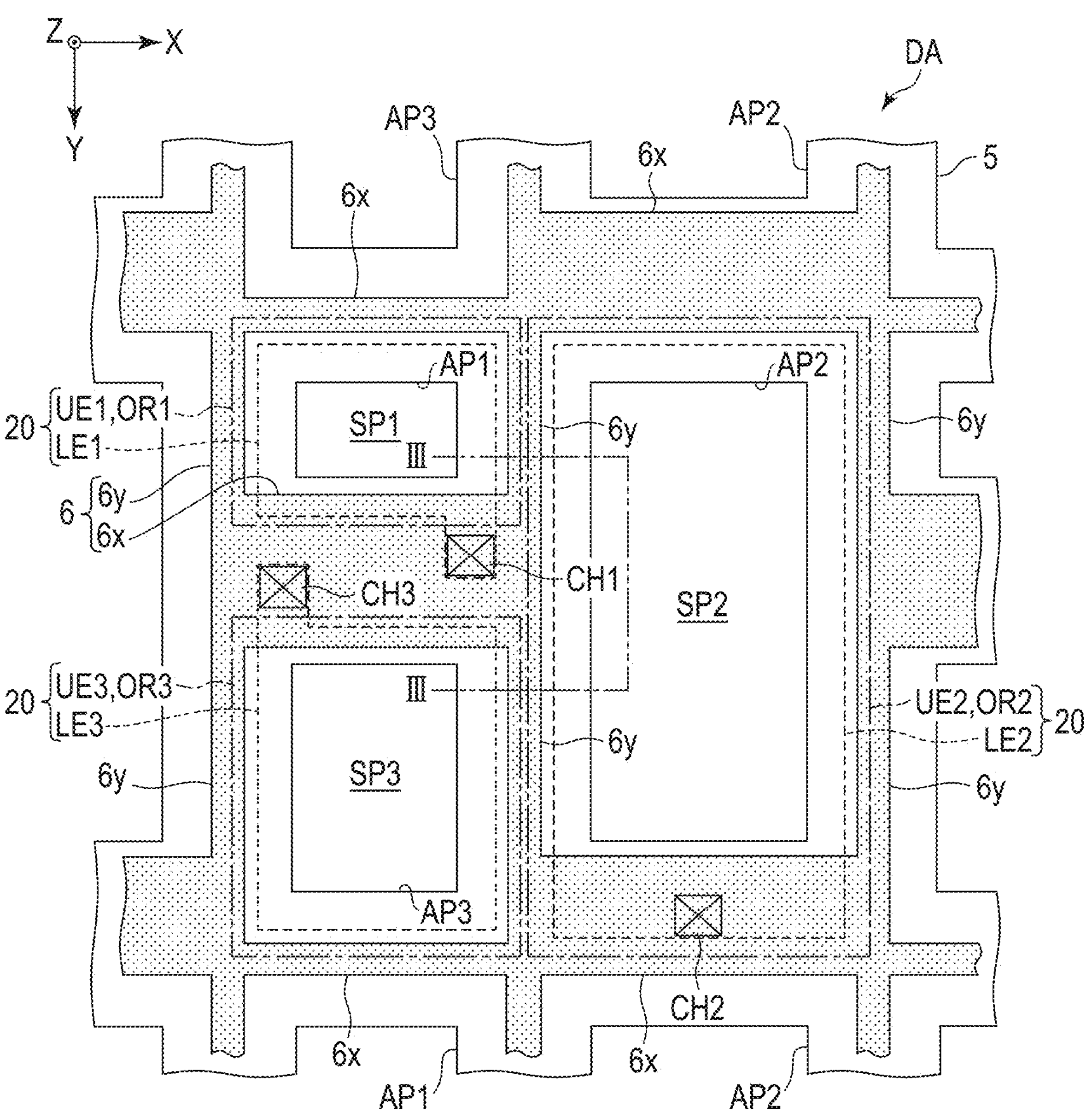
F I G. 2

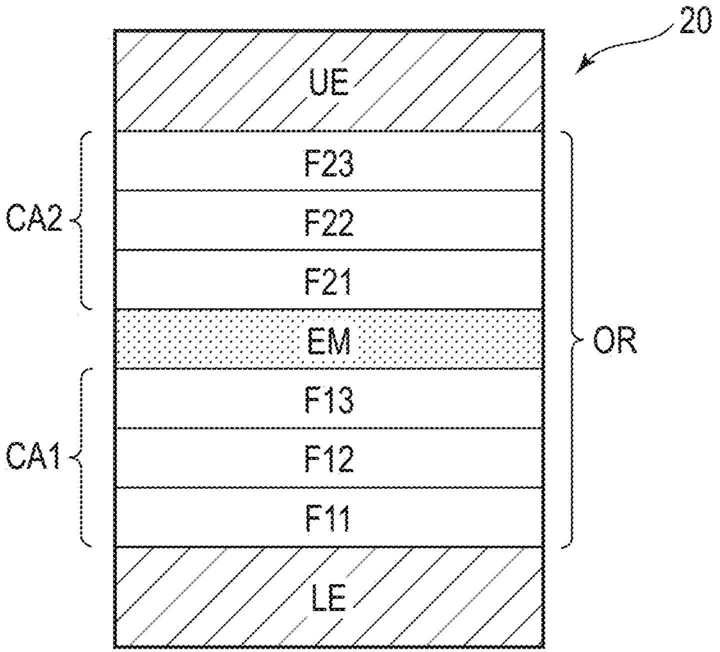
F I G. 4

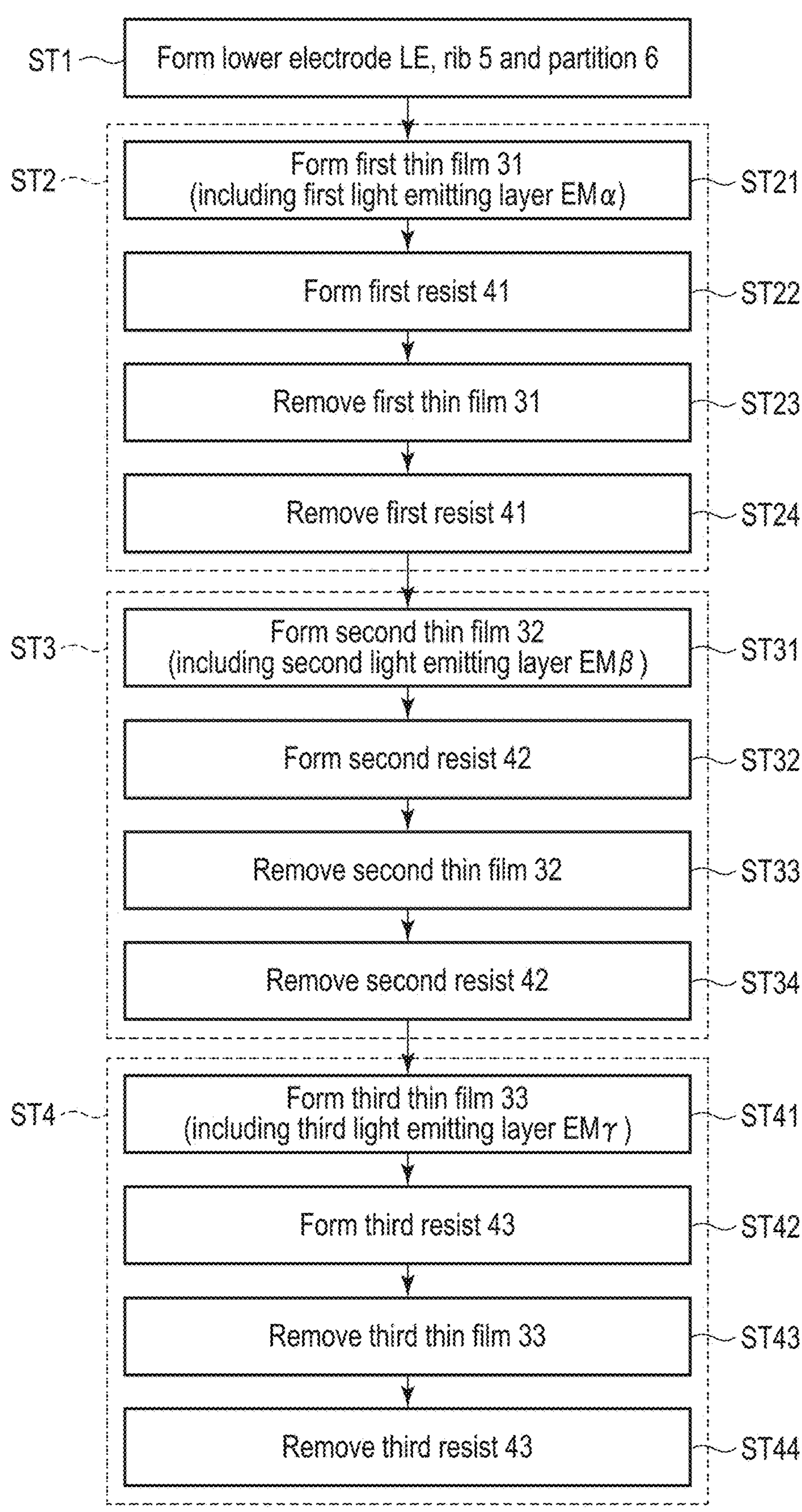
F I G. 5

DISPLAY DEVICE HAVING OVERHANG STRUCTURE AND SEALING LAYER

CROSS-REFERENCE TO RELATED APPLICATIONS

This application is based upon and claims the benefit of priority from Japanese Patent Application No. 2022-025972, filed Feb. 22, 2022, the entire contents of which are incorporated herein by reference.

FIELD

Embodiments described herein relate generally to a display device.

BACKGROUND

Recently, display devices to which an organic light-emitting diode (OLED) is applied as a display element have been put into practical use. Such a display element comprises a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer, in addition to a light-emitting layer.

In the process of manufacturing such a display device, there is a need for a technology to suppress the degradation of reliability.

BRIEF DESCRIPTION OF THE DRAWINGS

FIG. 1 is a diagram showing a configuration example of a display device DSP.

FIG. 2 is a diagram showing an example of layout of subpixels SP1, SP2 and SP3.

FIG. 4 is a diagram showing an example of a configuration of a display element 20.

FIG. 5 is a flow diagram illustrating an example of a manufacturing method for the display device DSP.

DETAILED DESCRIPTION

Figure 3:
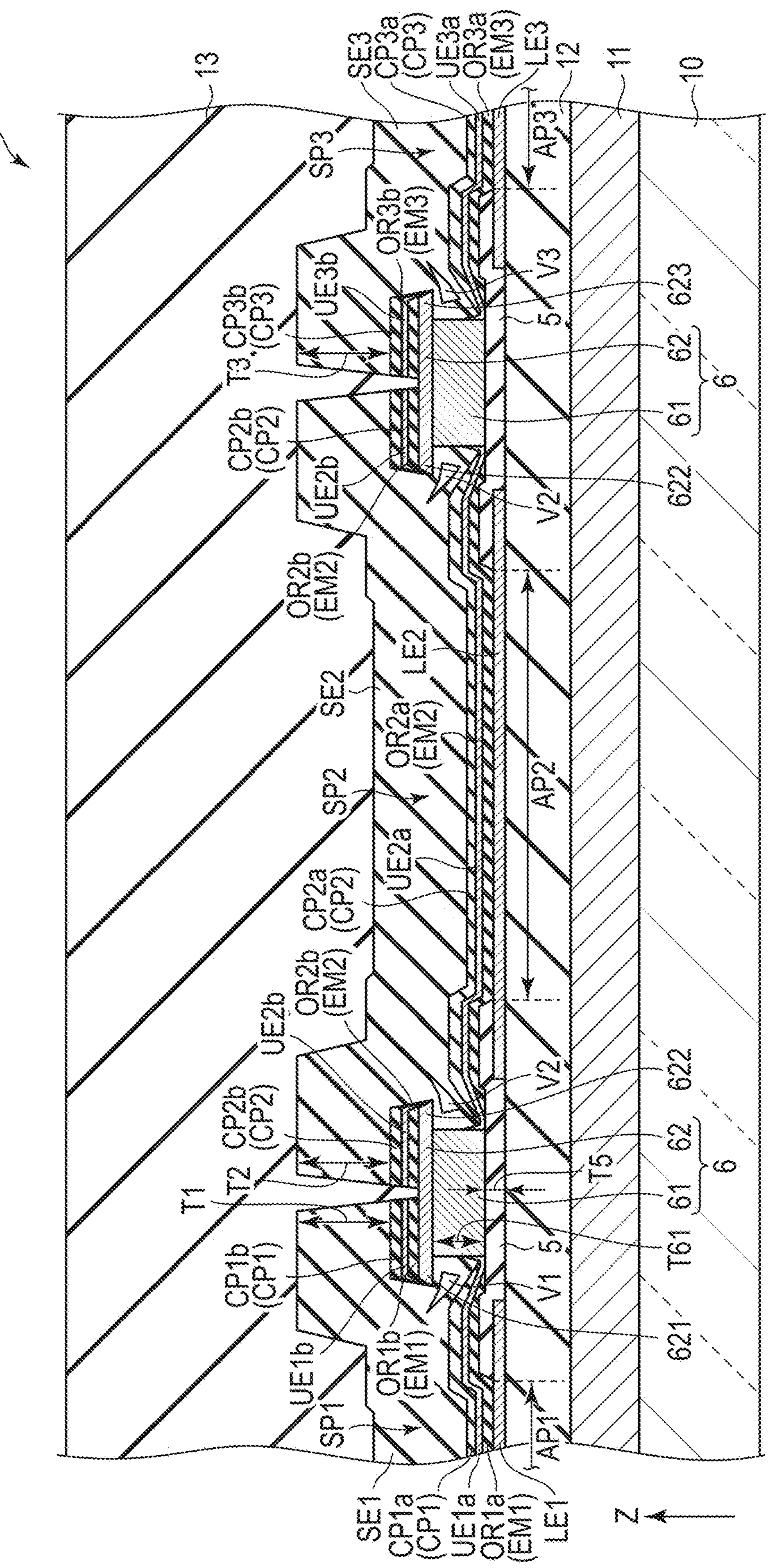
FIG. 3 is a schematic cross-sectional view of the display device DSP taken along line III-III in FIG. 2.

In general, according to one embodiment, a display device comprises a substrate, a first lower electrode and a second lower electrode disposed above the substrate, a rib including a first aperture overlapping the first lower electrode and a second aperture overlapping the second lower electrode, a partition including a lower portion disposed above the rib between the first aperture and the second aperture and an upper portion disposed on the lower portion and projecting from a side surface of the lower portion, a first organic layer disposed on the first lower electrode in the first aperture and including a first light-emitting layer, a second organic layer disposed on the second lower electrode in the second aperture and including a second light-emitting layer formed of a material different from that of the first light-emitting layer, a first upper electrode disposed on the first organic layer and in contact with the lower portion of the partition, a second upper electrode disposed on the second organic layer and in contact with the lower portion of the partition, a first sealing layer disposed above the first upper electrode, in contact with the lower portion of the partition and extending to above the upper portion of the partition, and a second sealing layer disposed above the second upper electrode, in contact with the lower portion of the partition, extending to above the upper portion of the partition, and spaced apart from the first sealing layer.

An embodiments will be described with reference to the accompanying drawings.

Note that the disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plane defined by the X-axis and the Y-axis is referred to as an X-Y plane, and viewing structural elements towards the X-Y plane is referred to as plan view.

The display device of this embodiment is an organic electroluminescent display device comprising an organic light emitting diode (OLED) as a display element, and could be mounted on a television, a personal computer, a vehicle-mounted device, a tablet, a smartphone, a mobile phone and the like.

FIG. 1 is a diagram showing a configuration example of a display device DSP.

The display device DSP comprises a display area DA which displays images and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in the first direction X and the second direction Y. Each pixel PX includes a plurality of subpixels SP. For example, each pixel PX includes a red subpixel SP1, a blue subpixel SP2 and a green subpixel SP3. Each pixel PX may include a subpixel SP which exhibits another color such as white in addition to subpixels SP1, SP2 and SP3 or instead of one of subpixels SP1, SP2 and SP3.

The subpixels SP each comprise a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

In the pixel switch 2, a gate electrode is connected to a scanning line GL. One of source and drain electrodes of the pixel switch 2 is connected to a signal line SL, and the other is connected to a gate electrode of the drive transistor 3 and the capacitor 4. In the drive transistor 3, one of source and drain electrodes is connected to a power line PL and the capacitor 4, and the other is connected to an anode of the display element 2.

Note that the configuration of the pixel circuit 1 is not limited to that of the example shown in the drawing. For example, the pixel circuit 1 may comprise more thin-film transistors and capacitors.

The display element 20 is an organic light-emitting diode (OLED) as a light-emitting element, which may be referred to as an organic EL element. For example, a subpixel SP1 comprises a display element 20 which emits light corresponding to a red wavelength range, a subpixel SP2 comprises a display element 20 which emits light corresponding to a blue wavelength range, and a subpixel SP3 comprises a display element 20 which emits light corresponding to a green wavelength range.

FIG. 2 is a diagram showing an example of the layout of the subpixels SP1, SP2 and SP3.

In the example shown in FIG. 2, the subpixels SP1 and SP3 are arranged in the second direction Y. Further, each of the subpixels SP1 and SP3 is adjacent to subpixel SP2 in the first direction X.

When the subpixels SP1, SP2 and SP3 are arranged in such a layout, a column in which subpixels SP1 and SP3 are arranged alternately in the second direction Y and a column in which a plurality of subpixels SP2 are arranged in the second direction Y are formed in the display area DA. These columns are arranged alternately in the first direction X.

The layout of the subpixels SP1, SP2 and SP3 is not limited to that of the example in FIG. 2. As another example, the subpixels SP1, SP2 and SP3 in each pixel PX may be arranged in order in the first direction X.

In the display area DA, a rib 5 and a partition 6 are disposed. The rib 5 include apertures AP1, AP2 and AP3 in subpixels SP1, SP2 and SP3, respectively. In the example of FIG. 2, the aperture AP3 is larger than the aperture AP1, and the aperture AP2 is larger than the aperture AP3.

The partition 6 overlaps the rib 5 in plan view. The partition 6 includes a plurality of first partitions 6*x* extending in the first direction X and a plurality of second partitions 6*y* extending in the second direction Y. The first partitions 6*x* are each disposed between the apertures AP1 and AP3 adjacent to each other in the second direction Y and between two apertures AP2 adjacent to each other in the second direction Y, respectively. The second partitions 6*y* are each disposed between the apertures AP1 and AP2 adjacent to each other in the first direction X and between the apertures AP2 and AP3 adjacent to each other in the first direction X, respectively.

In the example of FIG. 2, the first partitions 6*x* and the second partitions 6*y* are connected to each other. Thus, the partition 6 is formed as a whole into a lattice shape which surrounds the apertures AP1, AP2 and AP3. In other words, the partition 6 comprises apertures in subpixels SP1, SP2 and SP3 in a manner similar to that of the rib 5.

The subpixel SP1 includes a lower electrode LE1, an upper electrode UE1 and an organic layer OR1, each overlapping the aperture AP1. The subpixel SP2 includes a lower electrode LE2, an upper electrode UE2 and an organic layer OR2, each overlapping the aperture AP2. The subpixel SP3 includes a lower electrode LE3, an upper electrode UE3 and an organic layer OR3, each overlapping the aperture AP3.

In the example in FIG. 2, outlines of the lower electrodes LE1, LE2 and LE3 are shown by dotted lines, and outlines of the organic layers OR1, OR2 and OR3 and those of the upper electrodes UE1, UE2 and UE3 are shown by single-dotted lines. The peripheral portion of each of the lower electrodes LE1, LE2 and LE3 overlaps the rib 5. The outline of the upper electrode UE1 substantially matches that of the organic layer OR1, and the peripheral portion of each of the upper electrode UE1 and the organic layer OR1 overlaps the partition 6. The outline of the upper electrode UE2 substantially matches the outline of the organic layer OR2, and the peripheral portion of each of the upper electrode UE2 and the organic layer OR2 overlaps the partition 6. The outline of the upper electrode UE3 substantially matches the outline of the organic layer OR3, and the peripheral portion of each of the upper electrode UE3 and the organic layer OR3 overlaps the partition 6.

The lower electrode LE1, the upper electrode UE1 and the organic layer OR1 constitute the display element 20 of the subpixel SP1. The lower electrode LE2, the upper electrode UE2 and the organic layer OR2 constitute the display element 20 of the subpixel SP2. The lower electrode LE3, the upper electrode UE3 and the organic layer OR3 constitute the display element 20 of the subpixel SP3. The lower electrodes LE1, LE2, and LE3 correspond to, for example, the anodes of the display elements 20. The upper electrodes UE1, UE2 and UE3 correspond to the cathodes of the display elements 20 or common electrodes.

The lower electrode LE1 is connected to the pixel circuit 1 of the subpixel SP1 (see FIG. 1) via a contact hole CH1. The lower electrode LE2 is connected to the pixel circuit 1 of the subpixel SP2 via a contact hole CH2. The lower electrode LE3 is connected to the pixel circuit 1 of the subpixel SP3 via a contact hole CH3.

FIG. 3 is a schematic cross-sectional view of the display device DSP taken along line III-III in FIG. 2.

On the substrate 10 described above, a circuit layer 11 is disposed. The circuit layer 11 includes various types of circuits such as the pixel circuit 1, and various types of lines such as scanning lines GL, signal lines SL, and power lines PL shown in FIG. 1. The circuit layer 11 is covered by an insulating layer 12. The insulating layer 12 functions as a planarization film that planarizes the unevenness caused by the circuit layer 11.

The lower electrodes LE1, LE2 and LE3 are disposed on the insulating layer 12. The rib 5 is disposed on the insulating layer 12 and the lower electrodes LE1, LE2 and LE3. End portions of the lower electrodes LE1, LE2 and LE3 are covered by the rib 5. In other words, the end portions of the lower electrodes LE1, LE2 and LE3 are located between the insulating layer 12 and the rib 5. Of the lower electrodes LE1, LE2 and LE3, between the lower electrodes which are adjacent to each other, the insulating layer 12 is covered by the rib 5.

The partition 6 includes a lower portion (stem) 61 disposed on the rib 5 and upper portion (shade) 62 disposed on the lower portions 61. The lower portion 61 of the partition 6 shown on the left side of the drawing is located between the aperture AP1 and the aperture AP2. The lower portion 61 of the partition 6 shown on the right side of the drawing is located between the aperture AP2 and the aperture AP3. The upper portion 62 has a width greater than that of the lower portion 61. Thus, in FIG. 3, the both end portions of the upper portion 62 protrude from the side surfaces of the lower portion 61. Such a shape of the partition 6 can as well be referred to as an overhang. The portions of the upper portion 62, which protrude further than the lower portion 61 may simply be referred to as protruding portions.

The organic layer OR1 shown in FIG. 2 includes a first portion OR1*a* and a second portion OR1*b* spaced apart from each other as shown in FIG. 3. The first portion OR1*a* is in contact with the lower electrode LE1 via the aperture AP1, covers the lower electrode LE1, and overlaps a part of the rib 5. The second portion OR1*b* is disposed on the upper portion 62.

The upper electrode UE1 shown in FIG. 2 includes a first portion UE1*a* and a second portion UE1*b* spaced apart from each other as shown in FIG. 3. The first portion UE1*a* opposes the lower electrode LE1 and is disposed on the first portion OR1*a*. Further, the first portion UE1*a* is in contact with a side surface of the lower portion 61. The second portion UE1*b* is located above the partition 6 and is disposed on the second portion OR1*b*.

The first portion OR1*a* and the first portion UE1*a* are located below the upper portion 62.

The organic layer OR2 shown in FIG. 2 includes a first portion OR2*a* and a second portion OR2*b* spaced apart from each other as shown in FIG. 3. The first portion OR2*a* is in contact with the lower electrode LE2 via the aperture AP2, covers the lower electrode LE2, and overlaps a part of the rib 5. The second portion OR2*b* is disposed on the upper portion 62.

The upper electrode UE2 shown in FIG. 2 includes a first portion UE2*a* and a second portion UE2*b* spaced apart from each other as shown in FIG. 3. The first portion UE2*a* opposes the lower electrode LE2 and is disposed on the first portion OR2*a*. Further, the first portion UE2*a* is in contact with a side surface of the lower portion 61. The second portion UE2*b* is located above the partition 6 and is disposed on the second portion OR2*b*.

The first portion OR2*a* and the first portion UE2*a* are located below the upper portion 62.

The organic layer OR3 shown in FIG. 2 includes a first portion OR3*a* and a second portion OR3*b* spaced apart from each other as shown in FIG. 3. The first portion OR3*a* is in contact with the lower electrode LE3 via the aperture AP3, covers the lower electrode LE3, and overlaps a part of the rib 5. The second portion OR3*b* is disposed on the upper portion 62.

The upper electrode UE3 shown in FIG. 2 includes a first portion UE3*a* and a second portion UE3*b* spaced apart from each other as shown in FIG. 3. The first portion UE3*a* opposes the lower electrode LE3 and is disposed on the first portion OR3*a*. Further, the first portion UE3*a* is in contact with a side surface of the lower portion 61. The second portion UE3*b* is located above the partition 6 and is disposed on the second portion OR3*b*.

The first portion OR3*a* and the first portion UE3*a* are located below the upper portion 62.

In the example shown in FIG. 3, the subpixels SP1, SP2 and SP3 include cap layers (optical adjustment layers) CP1, CP2 and CP3 to adjust the optical properties of light emitted from the light-emitting layers of the organic layers OR1, OR2 and OR3.

The cap layer CP1 includes a first portion CP1*a* and a second portion CP1*b* spaced apart from each other. The first portion CP1*a* is located in the aperture AP1, disposed below the upper portion 62 and disposed on the first portion UE1*a*. The second portion CP1*b* is located above the partition 6 and disposed on the second portion UE1*b*.

The cap layer CP2 includes a first portion CP2*a* and a second portion CP2*b* spaced apart from each other. The first portion CP2*a* is located in the aperture AP2, disposed below the upper portion 62 and disposed on the first portion UE2*a*. The second portion CP2*b* is located above the partition 6 and disposed on the second portion UE2*b*.

The cap layer CP3 includes a first portion CP3*a* and a second portion CP3*b* spaced apart from each other. The first portion CP3*a* is located in the aperture AP3, disposed below the upper portion 62 and disposed on the first portion UE3*a*. The second portion CP3*b* is located above the partition 6 and disposed on the second portion UE3*b*.

In the subpixels SP1, SP2 and SP3, sealing layers SE1, SE2 and SE3 are disposed, respectively.

The sealing layer SE1 is in contact with the first portion CP1*a*, the lower portions 61 and the upper portions 62 of the partition 6, and the second portion CP1*b*, and continuously covers components of the subpixel SP1. In the example illustrated, the sealing layer SE1 includes a closed void V1 below the upper portion 62 of the partition 6 (below a protruding portion 621). The void V1 is spaced apart from the partition 6. The void V1 is surrounded by portions of the sealing layer SE1, which are in contact with the side surface of the lower portion 61 of the partition 6, the bottom surface of the upper portion 62 of the partition 6, and the first portion CP1*a*. The void V1 is formed along the entire circumference of the partition 6 which surrounds the aperture AP1, but may be partially missing. Further, the void V1 is closed over the entirety.

The sealing layer SE2 is in contact with the first portion CP2*a*, the lower portion 61 and the upper portion 62 of the partition 6, and the second portion CP2*b*, and continuously covers components of the subpixel SP2. The sealing layer SE2 includes a closed void V2 below the upper portion 62 of the partition 6 (below a protruding portion 622). The void V2 is located on an opposite side to the void V1 while interposing the partition 6 therebetween. The void V2 is formed along the entire circumference of the partition 6 which surrounds the aperture AP2, but may be partially missing. Further, the void V2 is closed over the entirety.

The sealing layer SE3 is in contact with the first portion CP3*a*, the lower portion 61 and the upper portion 62 of the partition 6, and the second portion CP3*b*, and continuously covers components of the subpixel SP3. The sealing layer SE3 includes a closed void V3 below the upper portion 62 of the partition 6 (below a protruding portion 623). The void V3 is located on an opposite side to the void V2 while interposing the partition 6 therebetween. The void V3 is formed along the entire circumference of the partition 6 which surrounds the aperture AP3, but may be partially missing. Further, the void V3 is closed over the entirety.

The sealing layers SE1, SE2 and SE3 are covered by a protective layer 13.

In the example shown in FIG. 3, on the partition 6 between the subpixels SP1 and SP2, the second portion OR1*b* of the organic layer OR1 is spaced apart from the second portion OR2*b* of the organic layer OR2, the second portion UE1*b* of the upper electrode UE1 is spaced apart from the second portion UE2*b* of the upper electrode UE2, the second portion CP1*b* of the capping layer CP1 is spaced apart from the second portion CP2*b* of the cap portion CP2, and the sealing layer SE1 is spaced apart from the sealing layer SE2. The protective layer 13 is disposed between the second portion OR1*b* and the second portion OR2*b*, between the second portion UE1*b* and the second portion UE2*b*, between the second portion CP1*b* and the second portion CP2*b*, and between the sealing layer SE1 and the sealing layer SE2.

Further, on the partition 6 between the subpixels SP2 and SP3, the second portion OR2*b* of the organic layer OR2 is spaced apart from the second portion OR3*b* of the organic layer OR3, the second portion UE2*b* of the upper electrode UE2 is spaced apart from the second portion UE3*b* of the upper electrode UE3, the second portion CP2*b* of the cap layer CP2 is spaced apart from the second portion CP3*b* of the cap portion CP3, and the sealing layer SE2 is spaced apart from the sealing layer SE3. The protective layer 13 is disposed between the second portion OR2*b* and the second portion OR3*b*, between the second portion UE2*b* and the second portion UE3*b*, between the second portion CP2*b* and the second portion CP3*b*, and between the sealing layer SE2 and the sealing layer SE3.

The insulating layer 12 is an organic insulating layer. The rib 5 and the sealing layers SE1, SE2 and SE3 are inorganic insulating layers.

The rib 5 and the sealing layers SE1, SE2 and SE3 are formed, for example, of the same inorganic insulating material.

The rib 5 is formed, for example, of silicon nitride (SiNx). Note that the rib 5 may be formed as a single layer of any one of silicon oxide (SiOx), silicon oxynitride (SiON) and aluminum oxide ($Al_2O_3$). Further, the rib 5 may be formed as a stacked multilayer of any combination of at least two of a silicon nitride layer, a silicon oxide layer, a silicon oxynitride layer and an aluminum oxide layer.

The sealing layers SE1, SE2 and SE3 are formed, for example, of silicon nitride (SiNx).

The lower portion 61 of the partition 6 is formed of a conductive material and is electrically connected to the first portions UE1*a*, UE2*a* and UE3*a* of the upper electrodes. Both the lower portion 61 and the upper portion 62 of the partition 6 may be conductive.

It is desirable that a thickness T5 of the rib 5 is less than thicknesses of the partition 6 and the insulation layer 12. For example, the thickness T5 of the rib 5 is 200 nm or more and 400 nm or less.

Directly above the upper portion 62 of the partition 6, a thickness T1 of the sealing layer SE1, a thickness T2 of the sealing layer SE2 and a thickness T3 of the sealing layer SE3 are approximately equal to each other and are 1 μm or more and 5 μm or less.

A thickness T61 of the lower portion 61 of the partition 6 (a thickness from the upper surface of the rib 5 to the lower surface of the upper portion 62), is greater than the thickness T5 of the rib 5. The thickness T61 of the lower portion 61 of the partition 6 is 300 nm or more and 1 μm or less. The thicknesses T1 to T3 are greater than the thickness T61 and are twice or more and five times or less the thickness T61.

The lower electrodes LE1, LE2 and LE3 may be formed of a transparent conductive material such as ITO, or may have a stacked multilayer structure of a metal material such as silver (Ag) and a transparent conductive material. The upper electrodes UE1, UE2 and UE3 are formed, for example, of a metal material such as an alloy of magnesium and silver (MgAg). The upper electrodes UE1, UE2 and UE3 may be formed of a transparent conductive material such as ITO.

When a potential of the lower electrodes LE1, LE2 and LE3 is relatively higher than a potential of the upper electrodes UE1, UE2 and UE3, the lower electrodes LE1, LE2 and LE3 correspond to anodes and the upper electrodes UE1, UE2 and UE3 correspond to cathodes. When the potential of the upper electrodes UE1, UE2 and UE3 is relatively higher than the potential of the lower electrodes LE1, LE2 and LE3, the upper electrodes UE1, UE2 and UE3 correspond to the anodes and the lower electrodes LE1, LE2 and LE3 correspond to the cathodes.

The organic layers OR1, OR2 and OR3 include a plurality of functional layers. The first portion OR1*a* and the second portion OR1*b* of the organic layer OR1 include light-emitting layers EM1 formed of the same material. The first portion OR2*a* and the second portion OR2*b* of the organic layer OR2 include light-emitting layers EM2 formed of the same material. The light-emitting layers EM2 are formed of a material different from that of the light-emitting layers EM1. The first portion OR3*a* and the second portion OR3*b* of the organic layer OR3 include light-emitting layers EM3 formed of the same material. The light-emitting layers EM3 are formed of a material different from that of the light-emitting layers EM1 or EM2. The material used to form the light-emitting layers EM1, the material used to form the light-emitting layers EM2 and the material used to form the light-emitting layers EM3 are materials which emit light of wavelength ranges different from each other.

The cap layers CP1, CP2 and CP3 are formed by, for example, a multilayer of transparent thin films. The multilayer may include a thin film formed of inorganic material and a thin film formed of organic material, as thin films. These thin films have refractive indices different from each other. The materials of the thin films which constitutes the multilayer are different from the material of the upper electrodes UE1, UE2 and UE3, and also different from the material of the sealing layers SE1, SE2 and SE3. Note that the cap layers CP1, CP2 and CP3 may be omitted.

The protective layer 13 is formed by a multilayer of transparent thin films and includes, for example, a thin film formed of inorganic material and a thin film formed of organic material, as thin films.

To the partition 6, a common voltage is supplied. The common voltage is supplied to each of the first portions UE1*a*, UE2*a* and UE3*a* of the upper electrodes, which are in contact with the side surface of the lower portion 61. To the lower electrodes LE1, LE2 and LE3, respective pixel voltages are supplied via the pixel circuits 1 of the subpixels SP1, SP2 and SP3, respectively.

When a potential difference is formed between the lower electrode LE1 and the upper electrode UE1, the light-emitting layer EM1 of the first portion OR1*a* of the organic layer OR1 emits light of the red wavelength range. When a potential difference is formed between the lower electrode LE2 and the upper electrode UE2, the light-emitting layer EM2 of the first portion OR2*a* of the organic layer OR2 emits light of the blue wavelength region. When a potential difference is formed between the lower electrode LE3 and the upper electrode UE3, the light-emitting layer EM3 of the first portion OR3*a* of the organic layer OR3 emits light of the green wavelength range.

As another example, the light-emitting layers of the organic layers OR1, OR2 and OR3 may emit light of the same color (for example, white). In this case, the display device DSP may comprise color filters which convert the light emitted from the light-emitting layers into light of colors corresponding to the subpixels SP1, SP2 and SP3, respectively. Further, the display device DSP may comprise a layer containing quantum dots that are excited by the light emitted from the light-emitting layers and generates light of colors corresponding to the subpixels SP1, SP2 and SP3, respectively.

In the examples shown in FIGS. 1 to 3, the aperture AP1 corresponds to a first aperture, the aperture AP2 corresponds to a second aperture, the lower electrode LE1 corresponds to a first lower electrode, the organic layer OR1 corresponds to a first organic layer, the light-emitting layer EM1 corresponds to a first light-emitting layer, the upper electrode UE1 corresponds to a first upper electrode, the cap layer CP1 corresponds to a first cap layer, the sealing layer SE1 corresponds to a first sealing layer, the lower electrode LE2 corresponds to a second lower electrode, the organic layer OR2 corresponds to a second organic layer, the light-emitting layer EM2 corresponds to a second light-emitting layer, the upper electrode UE2 corresponds to a second upper electrode, the cap layer CP2 corresponds to a second cap layer, and the sealing layer SE2 corresponds to a second sealing layer.

FIG. 4 is a diagram showing an example of the structure of the display element 20.

The lower electrode LE shown in FIG. 4 corresponds to each of the lower electrodes LE1, LE2 and LE3 in FIG. 3. The organic layer OR shown in FIG. 4 corresponds to each of the organic layers OR1, OR2 and OR3 in FIG. 3. The upper electrode UE shown in FIG. 4 corresponds to each of the upper electrodes UE1, UE2 and UE3 in FIG. 3.

The organic layer OR includes a carrier adjustment layer CA1, a light-emitting layer EM and a carrier adjustment layer CA2. The carrier adjustment layer CA1 is located between the lower electrode LE and the light-emitting layer EM, and the carrier adjustment layer CA2 is located between the light-emitting layer EM and the upper electrode UE. The carrier adjustment layers CA1 and CA2 include a plurality of functional layers. The following are descriptions of an example where the lower electrode LE corresponds to the anode and the upper electrode UE corresponds to the cathode.

The carrier adjustment layer CA1 includes a hole-injection layer F11, a hole-transport layer F12 and an electron blocking layer F13 and the like as functional layers. The hole-injection layer F11 is located on the lower electrode LE, the hole-transport layer F12 is located on the hole-injection layer F11, the electron blocking layer F13 is located on the hole-transport layer F12, and the light-emitting layer EM is located on the electron blocking layer F13.

The carrier adjustment layer CA2 includes a hole blocking layer F21, an electron-transport layer F22 and an electron-injection layer F23 and the like as functional layers. The hole blocking layer F21 is disposed on the light-emitting layer EM, the electron-transport layer F22 is disposed on the hole blocking layer F21, the electron-injection layer F23 is disposed on the electron-transport layer F22, and the upper electrode UE is disposed on the electron-injection layer F23.

Note that in addition to the functional layers described above, the carrier adjustment layers CA1 and CA2 may include other functional layer such as a carrier generation layer as needed, or at least one of the functional layers described above may be omitted.

Next, an example of a method of manufacturing the display device DSP will be described.

FIG. 5 is a flow diagram illustrating an example of the method of manufacturing the display device DSP.

The manufacturing method shown here roughly include the following processing step: preparing a processing substrate SUB which is the base of subpixels SPα, SPβ, and SPγ (step ST1); forming the subpixel SPα (step ST2); forming the subpixel SPβ, (step ST3); and forming the subpixel SPγ (step ST4). Note that the subpixels SPα, SPβ and SPγ here are any of the above-described subpixels SP1, SP2 and SP3.

In step ST1, first, the processing substrate SUB is prepared, in which lower electrodes LEα, LEβ and LEγ, the rib 5 and the partition 6 are formed on the substrate 10. As shown in FIG. 3, the circuit layer 11 and the insulating layer 12 are also formed between the substrate 10 and the lower electrodes LEα, LEβ and LEγ. Details thereof will be described later.

In step ST2, first, a first thin film 31 including the light-emitting layer EMα is formed on the processing substrate SUB (step ST21). Then, a first resist 41 patterned into a predetermined shape is formed on the first thin film 31 (step ST22). Then, a part of the first thin film 31 is removed by etching using the first resist 41 as a mask (step ST23). Then, the first resist 41 is removed (step ST24). As a result, the subpixel SPα is formed. The subpixel SPα comprises a display element 21 including the first thin film 31 of a predetermined shape.

In step ST3, a second thin film 32 including the light-emitting layer EMβ is formed on the processing substrate SUB (step ST31). Then, a second resist 42 patterned into a predetermined shape is formed on the second thin film 32 (step ST32). Then, a part of the second thin film 32 is removed by etching using the second resist 42 as a mask (step ST33). Then, the second resist 42 is removed (step ST34). As a result, the subpixel SPβ is formed. The subpixel SPβ comprises a display element 22 including the second thin film 32 of a predetermined shape.

In step ST4, a third thin film 33 including the light-emitting layer EMγ is formed on the processing substrate SUB (step ST41). Then, a third resist 43 patterned into a predetermined shape is formed on the third thin film 33 (step ST42). Then, a part of the third thin film 33 is removed by etching using the third resist 43 as a mask (step ST43). Then, the third resist 43 is removed (step ST44). As a result, the subpixel SPγ is formed. The subpixel SPγ comprises a display element 23 including the third thin film 33 of a predetermined shape.

The light-emitting layer EMα, the light-emitting layer EM and the light-emitting layer EMγ are formed of respective materials which emit light of wavelength ranges different from each other.

Note that the detailed illustrations of the second thin film 32, the light-emitting layer EM, the display element 22, the third thin film 33, the light-emitting layer EMγ, and the display element 23 will be omitted.

Step ST1 and step ST2 will now be described with reference to FIGS. 6 to 12.

Figure 6:
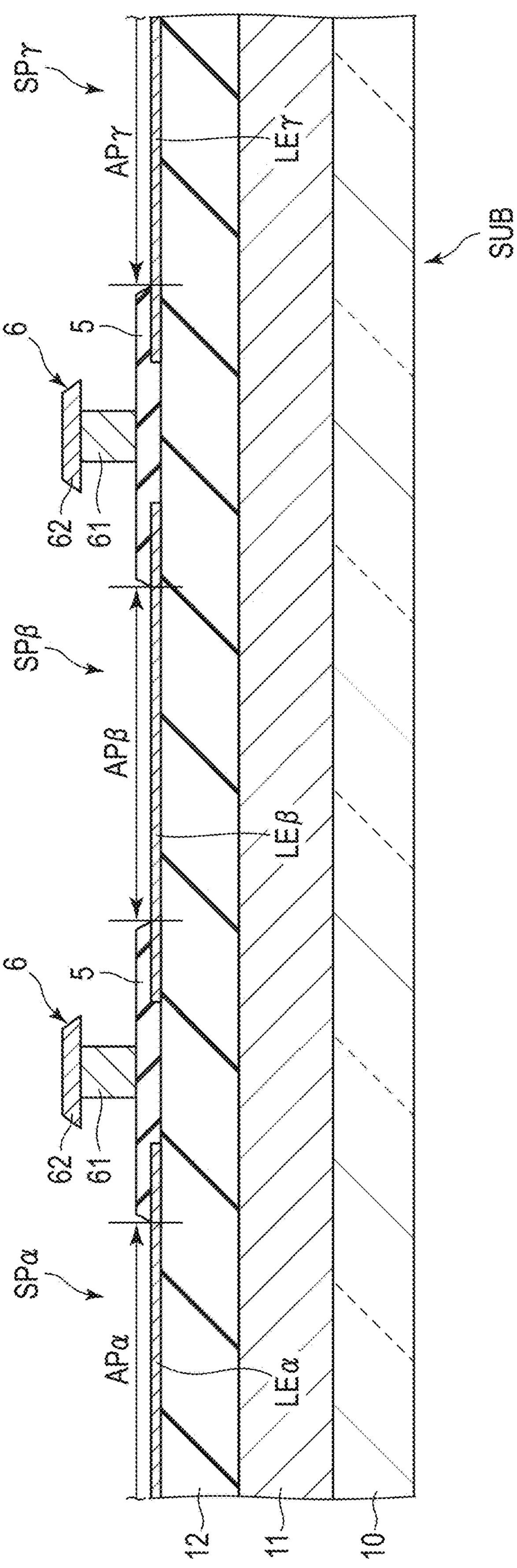
FIG. 6 is a diagram illustrating step ST1.

First, in step ST1, a processing substrate SUB is prepared as shown in FIG. 6. The processing step of preparing the processing substrate SUB includes the following steps of: forming a circuit layer 11 on the substrate 10; forming an insulating layer 12 on the circuit layer 11; forming, on the insulating layer 12, a lower electrode LEα of the subpixel SPα, a lower electrode LEβ of the subpixel SPβ and a lower electrode LEγ of the subpixel SPγ; forming the rib 5 including the apertures APα, APβ and APγ that respectively overlap the lower electrodes LEα, LEβ and LEγ; and forming the partition 6 including a lower portion 61 disposed on the rib 5 and an upper portion 62 disposed on the lower portion 61 and protruding from the side surface of the lower portion 61. Note that in FIGS. 7 to 12, the substrate 10 and the circuit layer 11, which are located lower than the insulating layer 12, will be omitted.

Figure 7:
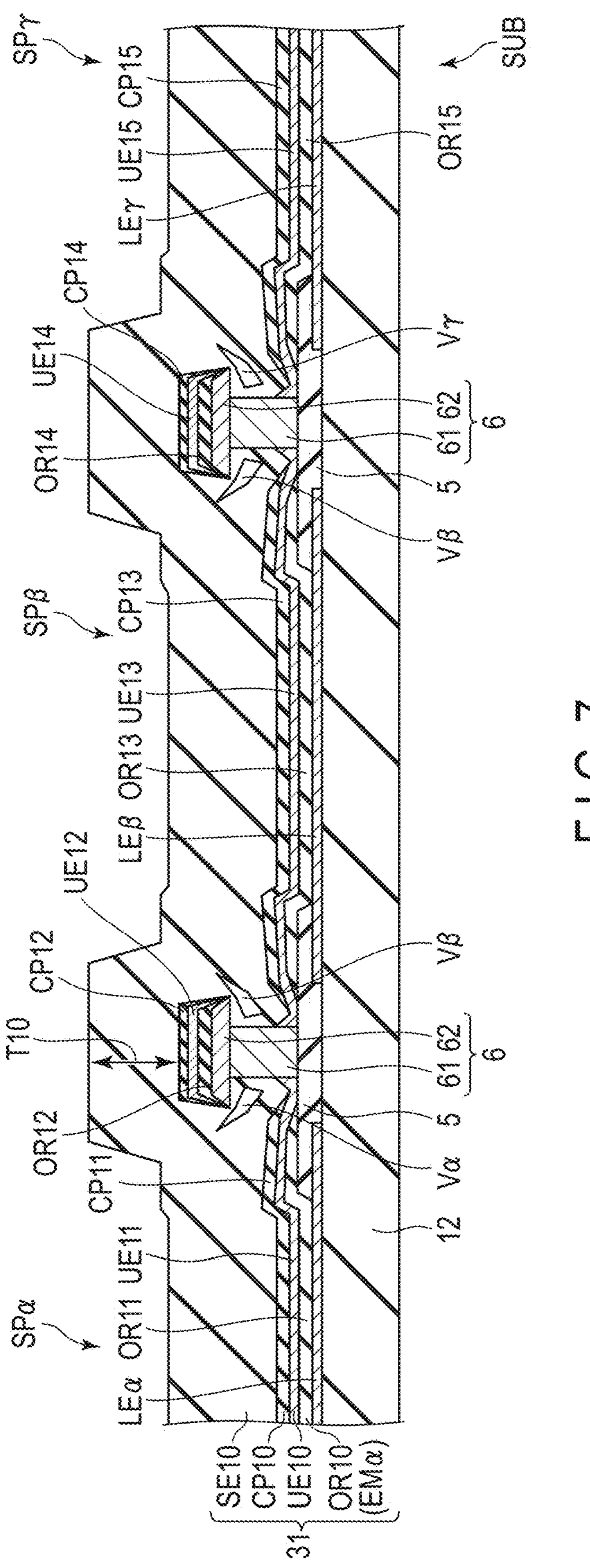
FIG. 7 is a diagram illustrating step ST21.

Subsequently, in step ST21, as shown in FIG. 7, the first thin film 31 is formed over the subpixel SPα, the subpixel SPβ and the subpixel SPγ. The processing step of forming the first thin film 31 includes the following steps of: forming an organic layer OR10 including the light-emitting layer EMα on the processing substrate SUB; forming an upper electrode UE10 on the organic layer OR10; forming a cap layer CP10 on the upper electrode UE10 and forming a sealing layer SE10 on the cap layer CP10. In other words, in the example illustrated, the first thin film 31 includes the organic layer OR10, the upper electrode UE10, the cap layer CP10 and the sealing layer SE10.

The organic layer OR10 includes an organic layer OR11, an organic layer OR12, an organic layer OR13, an organic layer OR14 and an organic layer OR15. The organic layer OR11, the organic layer OR12, the organic layer OR13, the organic layer OR14 and the organic layer OR15 all include the light-emitting layer EMα.

The organic layer OR11 is formed to cover the lower electrode LEα. The organic layer OR12 is spaced apart from the organic layer OR11 and is located on the upper portion 62 of the partition 6 between the lower electrode LEα and the lower electrode LEβ. The organic layer OR13 is spaced apart from organic layer OR12 and is formed to cover the lower electrode LEβ. The organic layer OR14 is spaced apart from the organic layer OR13 and is located on the upper portion 62 of the partition 6 between lower electrode LEβ and the lower electrode LEγ. The organic layer OR15 is spaced apart from the organic layer OR14 and is formed to cover the lower electrode LEγ.

The upper electrode UE10 includes an upper electrode UE11, an upper electrode UE12, an upper electrode UE13, an upper electrode UE14 and an upper electrode UE15.

The upper electrode UE11 is located on the organic layer OR11 and is in contact with the lower portion 61 of the partition 6 between the lower electrode LEα and the lower electrode LEβ. The upper electrode UE12 is spaced from the upper electrode UE11 and is located on the organic layer OR12 between the lower electrode LEα and the lower electrode LEβ. The upper electrode UE13 is spaced apart from the upper electrode UE12 and is located on the organic layer OR13. Further, in the example illustrated, the upper electrode UE13 is in contact with the lower portion 61 of the partition 6 between the lower electrode LEα and the lower electrode LEβ and in contact with the lower portion 61 of the partition 6 between the lower electrode LEβ and the lower electrode LEγ, but may be in contact with either one of the lower portions 61. The upper electrode UE14 is spaced apart from the upper electrode UE13 and is located on the organic layer OR14 between the lower electrode LEβ and the lower electrode LEγ. The upper electrode UE15 is spaced from the upper electrode UE14, is located on the organic layer OR15, and is in contact with the lower portion 61 of the partition 6 between the lower electrode LEβ and the lower electrode LEγ.

The cap layer CP10 includes a cap layer CP11, a cap layer CP12, a cap layer CP13, a cap layer CP14 and a cap layer CP15.

The cap layer CP11 is located on the upper electrode UE11. The cap layer CP12 is spaced apart from the cap layer CP11 and is located on upper electrode UE12. The cap layer CP13 is spaced from the cap layer CP12 and located on the upper electrode UE13. The cap layer CP14 is spaced apart from the cap layer CP13 and located on the upper electrode UE14. The cap layer CP15 is spaced apart from the cap layer CP14 and located on the upper electrode UE15.

The sealing layer SE10 is formed, for example, through a chemical-vapor deposition (CVD) process. The sealing layer SE10 is formed to cover the cap layer CP11, the cap layer CP12, the cap layer CP13, the cap layer CP14, the cap layer CP15 and the partition 6. The sealing layer SE10 which covers the partition 6 is in contact with a lower part of the upper portion 62 and a side surface of the lower portion 61. The sealing layer SE10 has a thickness T10, which is, for example, 3 μm. The sealing layer SE10 includes a void Vα opposing the subpixel SPα of the partition 6, a void Vβ, opposing the subpixel SPβ of the partition 6, and a void Vγ opposing the subpixel SPγ of the partition 6.

Figure 8:
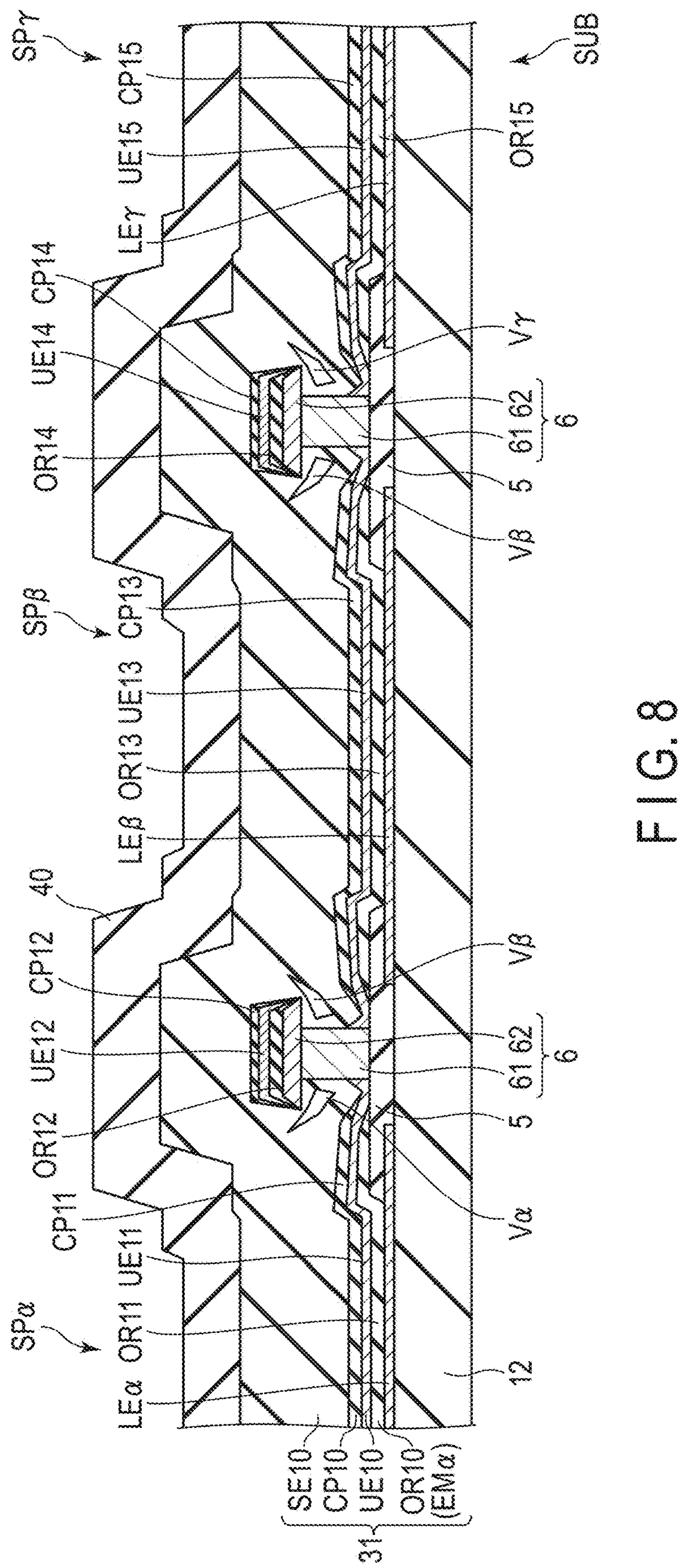
FIG. 8 is a diagram illustrating step ST22.

After that, in step ST22, first, a resist 40 is applied over the entire surface on the sealing layer SE10, as shown in FIG. 8. At this time, the void Vα, the void Vβ, and the void Vγ are all closed, and therefore that the resist 40 is prevented from flowing into the void Vα, the void Vβ, and the void Vγ. Then, the resist 40 is patterned.

The resist 40 is, for example, a photosensitive resin and is of a positive type that is photosensitive to light irradiation and exhibits solubility to a developing solution. Therefore, a mask including an aperture corresponding to the area from where the resist 40 is to be removed is prepared, and the resist 40 is exposed using this mask. Then, the resist 40 is developed using a developing solution, and the remaining resist is cured. The cured resist corresponds to the first resist 41.

Figure 9:
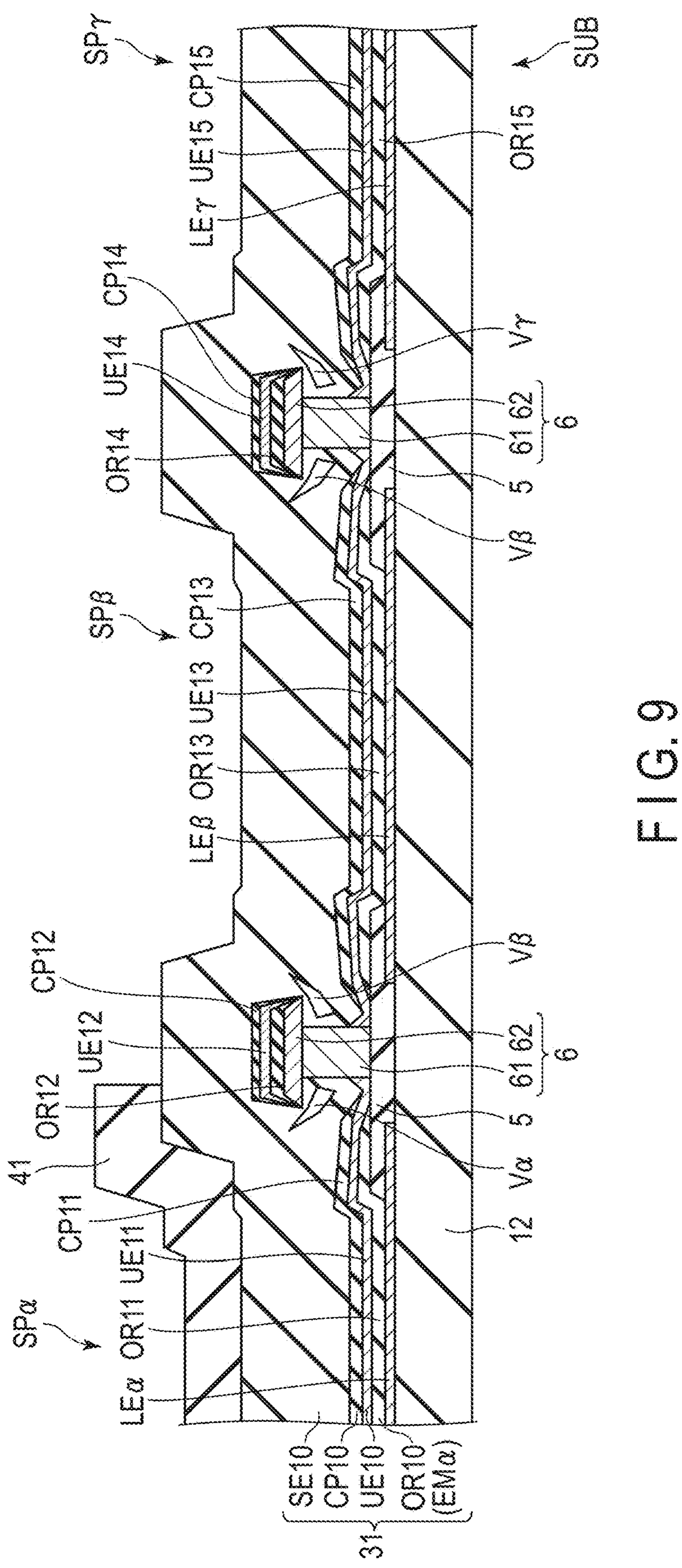
FIG. 9 is a diagram illustrating step ST22.

As shown in FIG. 9, the first resist 41 formed by patterning covers the subpixel SPα. In other words, the first resist 41 is located directly above the lower electrode LEα, the organic layer OR11, the upper electrode UE11 and the cap layer CP11. Further, the first resist 41 extends from the subpixel SPα to above the partition 6. Between the subpixel SPα and the subpixel SPβ, the first resist 41 is disposed on a subpixel SPα side (a left side in the drawing) and exposes the sealing layer SE10 on a subpixel SPβ side (a right side in the drawing). In the example illustrated, the first resist 41 exposes the sealing layer SE10 in the subpixel SPβ and the subpixel SPγ.

After that, in step ST23, the first thin film 31 exposed from the first resist 41 is removed by etching using the first resist 41 as a mask. The processing step of removing the first thin film 31 includes the following steps of: removing a part of the sealing layer SE10; removing a part of the cap layer CP10; removing a part of the upper electrode UE10; and removing a part of the organic layer OR10.

Figure 10:
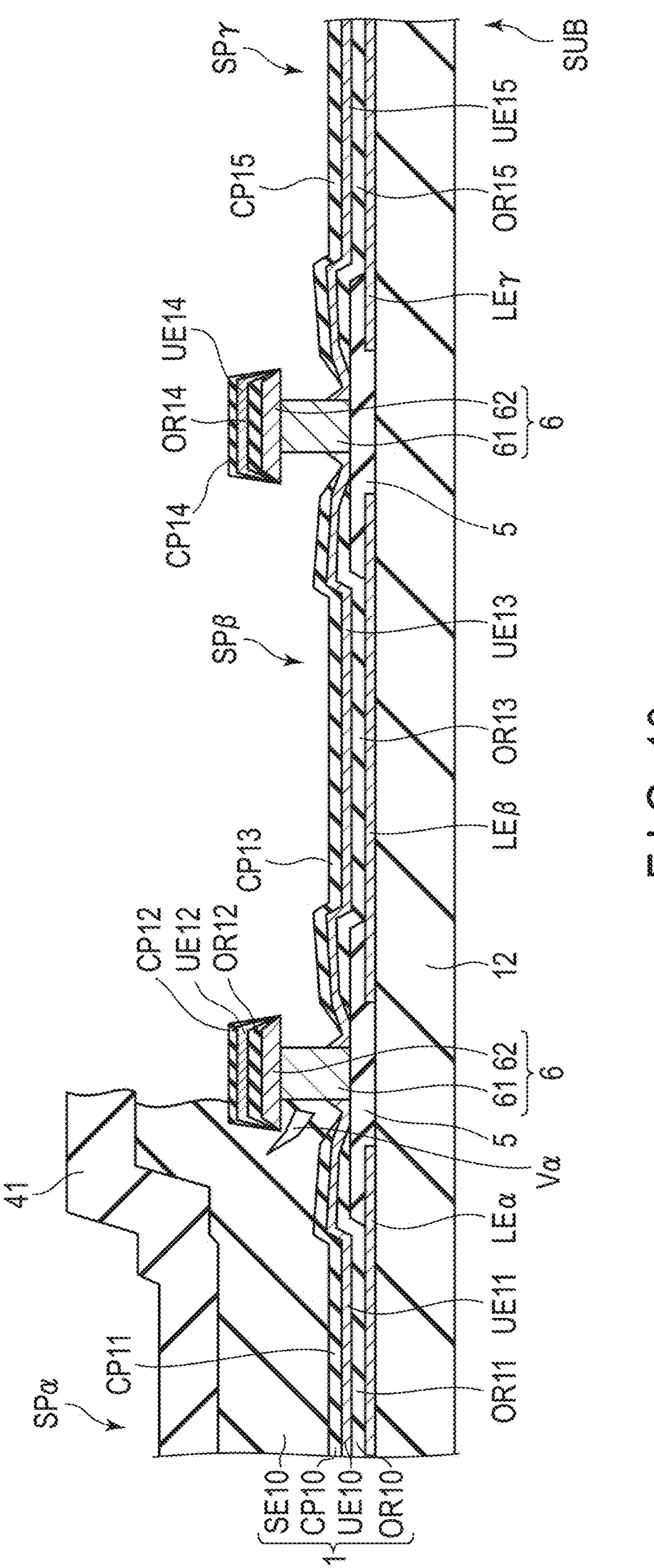
FIG. 10 is a diagram illustrating step ST23.

First, as shown in FIG. 10, dry etching is performed using the resist 41 as a mask to remove a part of the sealing layer SE10 exposed from the resist 41. In the example illustrated, of the sealing layer SE10, the portion which covers the subpixel SPα (a portion covering the cap layer CP11) and the portion on the subpixel SPα side (the left side in the drawing) directly above the partition 6 (the portion of the cap layer CP12, which covers the subpixel SPα side) remain. On the other hand, of the sealing layer SE10, the portion on the subpixel SPβ side (the right side in the drawing) directly above the partition 6 (the portion of the cap layer CP12, which covers the subpixel SPβ side), the portion which covers the subpixel SPβ (the portion covering the cap layer CP13), the portion which covers the partition 6 between the subpixel SPβ and the subpixel SPγ (the portion covering the cap layer CP14), and the portion which covers the subpixel SPγ (the portion covering the cap layer CP15) are removed. As a result, a part of the cap layer CP12, the cap layer CP13, the cap layer CP14 and the cap layer CP15 are exposed from the sealing layer SE10.

Figure 11:
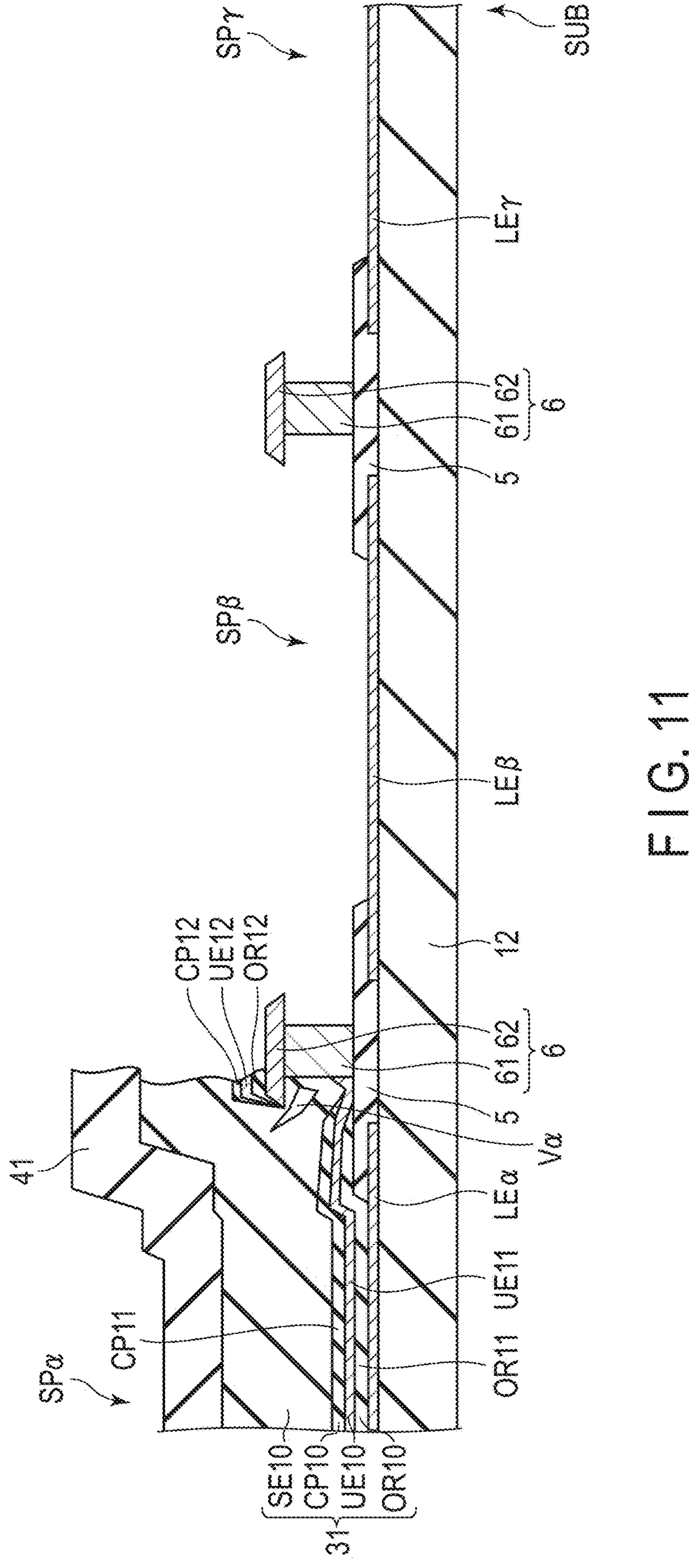
FIG. 11 is a diagram illustrating step ST23.

Subsequently, as shown in FIG. 11, etching is performed using the first resist 41 as a mask to remove a part of the cap layer CP10 exposed from the first resist 41 and the sealing layer SE10. In the example illustrated, a part of the cap layer CP12, the entire cap layer CP13, the entire cap layer CP14 and the entire cap layer CP15 are removed.

Then, etching is performed using the first resist 41 as a mask to remove a part of the upper electrode UE10 exposed from the first resist 41, the sealing layer SE10 and the cap layer CP10. In the example illustrated, a part of the upper electrode UE12, the entire upper electrode UE13, the entire upper electrode UE14 and the entire upper electrode UE15 are removed.

Subsequently, etching is performed using the first resist 41 as a mask to remove a part of the organic layer OR10 exposed from the first resist 41, the sealing layer SE10, the cap layer CP10 and the upper electrode UE10. In the example illustrated, a part of the organic layer OR12, the entire organic layer OR13, the entire organic layer OR14 and the entire organic layer OR15 are removed.

Thus, the lower electrode LEβ in the subpixel SPβ is exposed and the lower electrode LEγ in the subpixel SPγ is exposed.

Regarding the partition 6 between the subpixel SPα and the subpixel SPβ, directly above the upper portion 62, the organic layer OR12, the upper electrode UE12, the cap layer CP12 and the sealing layer SE10 remain on the subpixel SPα side, and the organic layer OR12, the upper electrode UE12, the cap layer CP12 and the sealing layer SE10 are removed on the subpixel SPβ side. As a result, the subpixel SPβ side of the partition 6 is exposed.

Further, the partition 6 between the subpixel SPβ and the subpixel SPγ is exposed.

Figure 12:
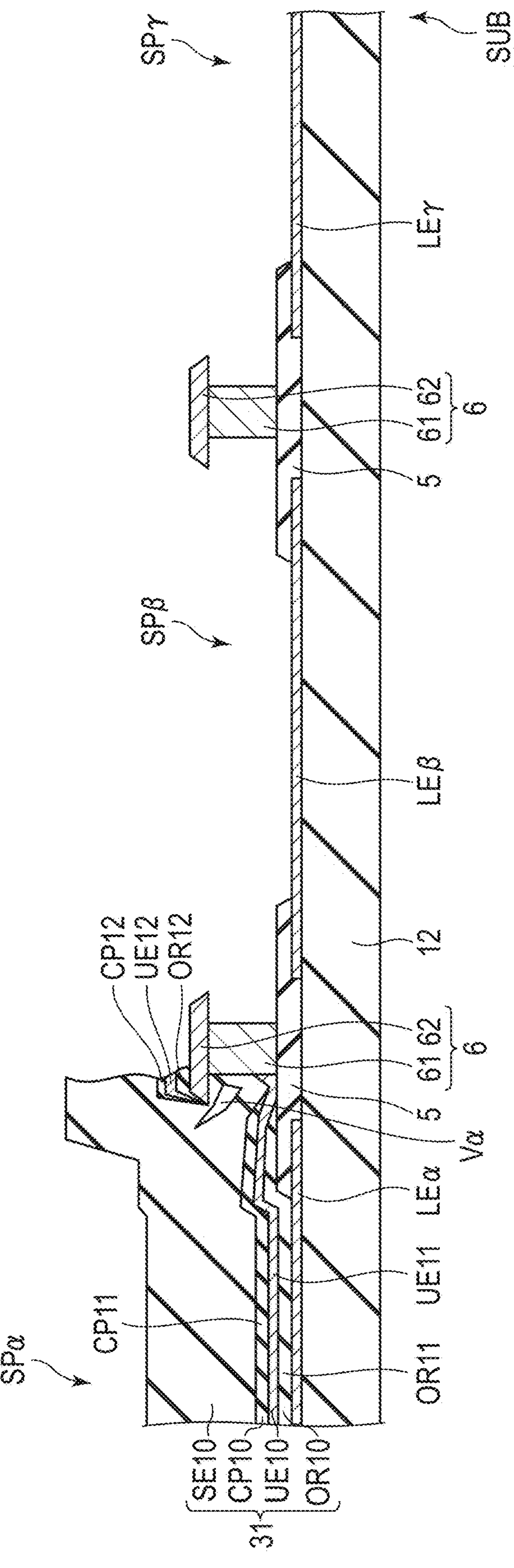
FIG. 12 is a diagram illustrating step ST24.

After that, in step ST24, the first resist 41 is removed as shown in FIG. 12. Thus, the sealing layer SE10 of the subpixel SPα is exposed. Through the steps ST21 to ST24, the display element 21 is formed in the subpixel SPα. The display element 21 is constituted by a lower electrode LEα, an organic layer OR11 including a light-emitting layer EMα, an upper electrode UE11 and a cap layer CP11. The display element 21 is covered by the sealing layer SE10.

On the partition 6 between the subpixel SPα and the subpixel SPβ, a stacked layer body of an organic layer OR12 including a light-emitting layer EMα, an upper electrode UE12 and a cap layer CP12 is formed, and the stacked layer body is covered by the sealing layer SE10. Further, of the partition 6, the portion on the subpixel SPα side is covered by the sealing layer SE10.

The subpixel SPα in the above-discussed example is any one of the subpixels SP1, SP2, and SP3 shown in FIG. 2. For example, when the subpixel SPα corresponds to the subpixel SP1, the lower electrode LEα corresponds to the first lower electrode LE1, the organic layer OR11 corresponds to the first portion OR1*a* of the first organic layer, the organic layer OR12 corresponds to the second portion OR1*b* of the first organic layer, the light-emitting layer EMα corresponds to the first light-emitting layer EM1, the upper electrode UE11 corresponds to the first portion UE1*a* of the first upper electrode, the upper electrode UE12 corresponds to the second portion UE1*b* of the first upper electrode, the cap layer CP11 corresponds to the first portion CP1*a* of the first cap layer, the cap layer CP12 corresponds to the second portion CP1*b* of the first cap layer, and the sealing layer SE10 corresponds to the first sealing layer SE1.

The following are descriptions of the case where, in the process of patterning the resist 40, the resist 40 flows below the upper portion 62 of the partition 6. As described above, when the resist 40 is of the positive type, the resist 40 located below the upper portion 62 is not exposed because it is in the shadow of the upper portion 62 and remains after development. Therefore, the sealing layer SE10 overlapping the residual resist 40 may not be sufficiently removed in the subsequent dry etching process and may remain. Further, in the dry etching process, there is a risk that products may appear due to carbon and other substances contained in the residual resist 40.

For example, in the above example, when the resist 40 remains on the partition 6 between the subpixel SPβ and the subpixel SPγ, or the products adheres to the partition 6, the sealing layer SE10 may remain on the side surface of the lower portion 61, and may cause poor electrical connection between the upper electrode in each of the subpixels SPβ and SPγ and the lower portion 61. Further, when forming the subpixel SPβ or the subpixel SPγ, cracks may occur in the sealing layer, resulting in sealing defects.

According to this embodiment, the flow of the resist 40 below the upper portion 62 of the partition 6 is suppressed. Therefore, in the dry etching process of the sealing layer SE10, the sealing layer SE10 of the subpixel not covered by the first resist 41 or the sealing layer SE10 covering the partition 6 is reliably removed. Moreover, the appearance of undesired products is suppressed. Thus, in the subpixel formation process at a later stage, the upper electrode and the lower portion are reliably electrically connected to each other. Further, in the subpixel formation process at a later stage, the display element is reliably sealed by the sealing layer and the formation of undesired holes (moisture entering paths) is suppressed. Therefore, the degradation of the reliability can be suppressed.

According to various studies carried out by the inventors, it has been confirmed that when the thickness of the sealing layer SE10 formed through one CVD process is set to 1 μm or more (or twice or more the thickness T61 of the lower portion 61), a closed void is formed in the sealing layer SE10, or the formation of a void is suppressed. On the other hand, if the thickness of the sealing layer SE10 becomes excessively thick, it may cause a decrease in the transmittance of light emitted from the display element. Therefore, the thickness of the sealing layer SE10 should preferably be set to 5 μm or less (or five times or less the thickness T61).

As described above, according to this embodiment, it is possible to provide a display device in which the degradation in reliability can be suppressed and the manufacturing yield can be improved.

Based on the display device described above as an embodiment of the present invention, all display devices that can be designed and modified as appropriate by a person skilled in the art and implemented also fall within the scope of the present invention as long as they encompass the gist of the invention.

Within the scope of the idea of the invention, those skilled in the art can conceive of various variations, which are also considered to be within the scope of the invention. For example, any addition, deletion, or design modification of a component, or any addition or omission of a process, or any modification of conditions, made by a person skilled in the art to the above-described embodiment, as appropriate, is included in the scope of the invention as long as it has the gist of the invention.

In addition, other effects brought about by the mode of operation described in the embodiment above, which are obvious from the description herein or which may be conceived by those skilled in the art, are naturally considered to be brought about by the present invention.

What is claimed is:

1. A display device comprising:

a substrate;

a first lower electrode and a second lower electrode disposed above the substrate;

a rib including a first aperture overlapping the first lower electrode and a second aperture overlapping the second lower electrode;

a partition including a lower portion disposed above the rib and between the first aperture and the second aperture, and an upper portion disposed on the lower portion and projecting from a side surface of the lower portion;

a first organic layer disposed on the first lower electrode and in the first aperture and including a first light-emitting layer;

a second organic layer disposed on the second lower electrode and in the second aperture and including a second light-emitting layer formed of a material different from that of the first light-emitting layer;

a first upper electrode disposed on the first organic layer and in contact with the lower portion of the partition;

a second upper electrode disposed on the second organic layer and in contact with the lower portion of the partition;

a first sealing layer disposed above the first upper electrode, in contact with the lower portion of the partition and extending to above the upper portion of the partition; and a second sealing layer disposed above the second upper electrode, in contact with the lower portion of the partition, extending to above the upper portion of the partition, and spaced apart from the first sealing layer.

2. The display device of claim 1, wherein each of the first sealing layer and the second sealing layer has a thickness of 1 μm or more and 5 μm or less, above the upper portion.

3. The display device of claim 1, wherein each of the first sealing layer and the second sealing layer has a thickness of twice or more and five times or less a thickness of the lower portion, above the upper portion.

4. The display device of claim 1, wherein the first sealing layer and the second sealing layer are formed of an inorganic insulating material.

5. The display device of claim 1, wherein the first sealing layer and the second sealing layer are formed of silicon nitride.

6. The display device of claim 1, wherein each of the first sealing layer and the second sealing layer includes a closed void below the upper portion.

7. The display device of claim 1, further comprising:

a first cap layer disposed on the first upper electrode and covered by the first sealing layer; and a second cap layer disposed on the second upper electrode and covered by the second sealing layer.

8. The display device of claim 7, wherein each of the first organic layer, the first upper electrode and the first cap layer includes a first portion located below the upper portion of the partition and a second portion located above the upper portion and spaced apart from the first portion, and the first sealing layer is in contact with the first portion and the second portion of the first cap layer.

9. The display device according to claim 8, wherein each of the second organic layer, the second upper electrode, and the second cap layer includes a first portion located below the upper portion of the partition and a second portion located above the upper portion and spaced apart from the first portion, and the second sealing layer is in contact with the first portion and the second portion of the second cap layer.

10. The display device according to claim 9, wherein the second portion of the first organic layer is spaced apart from the second portion of the second organic layer, the second portion of the first upper electrode is spaced apart from the second portion of the second upper electrode, and the second portion of the first cap layer is spaced apart from the second portion of the second cap layer.

11. The display device of claim 1, wherein the rib is formed of an inorganic insulating material.

12. The display device of claim 1, wherein the lower portion of the partition is formed of a conductive material and is electrically connected to the first upper electrode and the second upper electrode.

13. The display device of claim 6, wherein in a cross-sectional view, an entirety of the closed void of the first sealing layer is surrounded by the first sealing layer, and an entirety of the closed void of the second sealing layer is surrounded by the second sealing layer.

14. The display device of claim 13, wherein in the cross-sectional view, the rib, the lower portion of the partition, and the upper portion of the partition are stacked in a third direction, the rib, a part of the closed void of the first sealing layer, and the upper portion of the partition overlap with each other in the third direction, and the rib, a part of the closed void of the second sealing layer, and the upper portion of the partition overlap with each other in the third direction.

15. The display device of claim 14, wherein in the cross-sectional view, the part of the closed void of the first sealing layer is located between the rib and the upper portion of the partition in the third direction, and the part of the closed void of the second sealing layer is located between the rib and the upper portion of the partition in the third direction.

16. The display device of claim 13, wherein in the cross-sectional view, the rib, the lower portion of the partition, and the upper portion of the partition are stacked in a third direction, the closed void of the first sealing layer does not overlap the first aperture of the rib in the third direction, and the closed void of the second sealing layer does not overlap the second aperture of the rib in the third direction.

17. The display device of claim 13, wherein in the cross-sectional view, the rib, the lower portion of the partition, and the upper portion of the partition are stacked in a third direction, the upper portion of the partition includes a lower surface in direct contact with the lower portion of the partition, and an upper surface opposing the lower surface and being farther from the substrate in the third direction, the entirety of the closed void of the first sealing layer is closer to the substrate in the third direction compared to the upper surface of the upper portion of the partition, and the entirety of the closed void of the second sealing layer is closer to the substrate in the third direction compared to the upper surface of the upper portion of the partition.

18. The display device of claim 13, wherein in the cross-sectional view, the rib, the lower portion of the partition, and the upper portion of the partition are stacked in a third direction, the first lower electrode, the partition, and the second lower electrode are arranged in a first direction crossing the third direction, the first sealing layer includes a lower surface extending in the first direction, and an upper surface opposing the lower surface and being farther from the substrate in the third direction, the second sealing layer includes a lower surface extending in the first direction, and an upper surface opposing the lower surface and being farther from the substrate in the third direction, the entirety of the closed void of the first sealing layer is closer to the substrate in the third direction compared to the upper surface of the first sealing layer at directly above the first aperture of the rib, and the entirety of the closed void of the second sealing layer is closer to the substrate in the third direction compared to the upper surface of the second sealing layer at directly above the second aperture of the rib.

19. The display device of claim 10, wherein in a cross-sectional view, the rib, the lower portion of the partition, and the upper portion of the partition are stacked in a third direction, the second portion of the first organic layer, the second portion of the first upper electrode, and the second portion of the first cap layer do not overlap the first lower electrode in the third direction, and the second portion of the second organic layer, the second portion of the second upper electrode, and the second portion of the second cap layer do not overlap the second lower electrode in the third direction.

20. The display device of claim 1, wherein in a cross-sectional view, the rib, the lower portion of the partition, and the upper portion of the partition are stacked in a third direction, the first lower electrode, the partition, and the second lower electrode are arranged in a first direction crossing the third direction, the upper portion of the partition includes a lower surface in direct contact with the lower portion of the partition, and an upper surface opposing the lower surface and being farther from the substrate in the third direction, the first sealing layer includes a lower surface extending in the first direction, and an upper surface opposing the lower surface and being farther from the substrate in the third direction, the second sealing layer includes a lower surface extending in the first direction, and an upper surface opposing the lower surface and being farther from the substrate in the third direction, a first distance between the substrate and the upper surface of the first sealing layer directly above the first aperture of the rib in the third direction is greater than a third distance between the substrate and the upper surface of the upper portion of the partition in the third direction, and a second distance between the substrate and the upper surface of the second sealing layer directly above the second aperture of the rib in the third direction is greater than the third direction.

* * * * *